(12) United States Patent
Litmanen et al.

(10) Patent No.: US 6,366,171 B1
(45) Date of Patent: Apr. 2, 2002

(54) SINGLE-TO-DIFFERENTIAL LOW NOISE AMPLIFIER

(75) Inventors: Petteri M. Litmanen; Abdellatif Bellaouar, both of Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/544,101

(22) Filed: Apr. 6, 2000

(51) Int. Cl.$^7$ .............................. H03F 3/45; H03F 1/22
(52) U.S. Cl. ...................................... 330/301; 330/311
(58) Field of Search ................................ 330/292, 301, 330/305, 311; 333/25

(56) References Cited

U.S. PATENT DOCUMENTS 5,929,710 A * 7/1999 Bien ........................... 330/301

FOREIGN PATENT DOCUMENTS

EP 0 601 646 * 6/1994 .................. 330/301

OTHER PUBLICATIONS

"Understanding and Enhancing Sensitivity in Receivers for Wireless Applications", Texas Instruments, Technical brief SWRA030, Digital Signal Processing Solutions, May, 1999, 24 pages.

"Analog Applications", Analog and Mixed–Signal Products, Texas Instruments, Copyright 1999, Aug., 1999, 28 pages.

* cited by examiner

*Primary Examiner*—Steven J. Mottola
(74) *Attorney, Agent, or Firm*—J. Dennis Moore; W. James Brady, III; Frederick J. Telecky, Jr.

(57) ABSTRACT

The present invention relates to a single-to-differential signal transformation circuit which comprises a differential signal generation circuit which is operable to receive a single-ended signal and generate a pair of differential signals having a phase relationship associated therewith. The transformation circuit further comprises a phase analysis circuit operably coupled to the differential signal generation circuit which is operable to ascertain the phase relationship between the differential signals and generate a status indication associated therewith. In addition, a compensation circuit is operably coupled to the phase analysis circuit and is operable to alter a function of the transformation circuit based on the status indication from the phase analysis circuit such that the altered function causes the phase relationship of the differential signals which form a circuit output to be closer to 180 degrees than an initial phase relationship generated by the differential signal generation circuit. In such a manner, improved differential signal phase balance is achieved.

21 Claims, 6 Drawing Sheets

SINGLE-TO-DIFFERENTIAL LOW NOISE AMPLIFIER

TECHNICAL FIELD

The present invention relates generally to electrical circuits, and more particularly to a circuit and method of generating differential signals exhibiting phase accuracy at high frequencies.

BACKGROUND OF THE INVENTION

Electrical circuits are utilized in a myriad of diverse applications, for example, computers, communication devices, industrial equipment, etc. In many of the applications which employ such circuits, differential signals are utilized to effectuate various functions. In addition, in many applications, the frequency of signals within such circuits are increasing in order to provide improved speed, conforming to communication protocols or standards, etc. In high frequency applications such as RF (radio frequency) communications, circuits employing differential type signals sometimes suffer from problems relating to phase delay. That is, one of the differential signals (e.g., $RF_{out(+)}$) is not exactly 180 degrees out of the phase with the other corresponding differential signal (e.g., $RF_{out(-)}$). Such phase imbalances may result in various undesirable effects.

One type of circuit system which sometimes utilizes differential signals is a communications receiver in a wireless application such as a cellular phone. An exemplary portion of a conventional heterodyne type receiver is illustrated in prior art FIG. 1. A heterodyne receiver translates the desired RF signal to one or more intermediate frequencies before demodulation. The receiver system is composed of several active and passive function blocks and each contributes to the system's overall signal gain and noise figure (NF). The system 10 of FIG. 1 includes an antenna 12, a duplexer 14, an amplifier 16, one or more filters 18a and 18b, and a mixer 20 driven by a local oscillator 21 (LO).

The antenna 12 provides an interface between free space and the receiver input. The duplexer 14 interfaces with the antenna 12 and allows simultaneous transmitter and receiver operations with a single antenna. The duplexer 14 operates to isolate the receiver system 10 and a transmitter 22 from each other while providing a generally low loss connection to the antenna 12 for both systems.

The system 10 of FIG. 1 also includes the amplifier 16, typically a low-noise amplifier (LNA) that increases the amplitude of the signal received from the antenna 12 which allows for further processing by the receiver 10. An ideal amplifier increases the amplitude of the received signal without adding distortion or noise. Real world amplifiers, however, add noise and distortion to the received signal, and attempts are made to minimize signal degradations. The LNA 16 is the first amplifier after the antenna 12 in the system 10 and contributes most significantly to the system noise figure, consequently the amplifier 16 is typically designed to minimize noise, and hence the name LNA. The LNA 16 is typically constructed using active devices which operate in their linear range, however, the LNA output signal is not always perfectly linear, and distortion is added to the amplified signal due to nonlinearities of the one or more transistors therein.

The system 10 also includes one or more filters 18a and 18b, respectively. The filters form one or more networks which allow a range of RF frequencies to pass therethrough (oftentimes called bandpass filters). The filters block RF signals outside of their designed passband. When used, the RF filter 18a which is located before the LNA 16 is called a preselect filter and the post-amplifier RF filter 18b is often called the image-reject filter. The preselect filter 18a prevents signals far outside of the desired passband from saturating the front end and producing intermodulation distortion products related to those signals at far away frequencies, while the image-reject filter 18b rejects spurious response type signals. Lastly, the system 10 includes the mixer 20 which translates the received, filtered and amplified RF signal to both a higher and lower intermediate frequency (IF) value. One of the intermediate frequencies is passed while the other is rejected (e.g., called either up-conversion or down-conversion, respectively), using translation with the LO signal that mixes with the RF signal.

Many conventional mixers are designed to receive a differential input because differential signals help in decoupling the system 10 from noise in the integrated circuit substrate, thereby lowering the system NF, and aid in facilitating high device integration. Because the mixer 20 is designed to receive a differential signal input and the antenna 12 generates a single received signal, the system 10 must transform the single-ended signal into a differential signal somewhere between the antenna 12 and the mixer 20.

Conventional solutions which perform a transformation from a single-ended signal to differential signals before the LNA 16 have been found undesirable because prior to amplification the received signal is weak and the transformation results in too much loss, thereby degrading the integrity of the received signal. Similarly, conventional post-LNA transformation solutions have been found to be undesirable because of linearity issues. For example, a post-LNA solution sometimes utilizes a unity-type buffer coupled to the output of the LNA. Since the received signal exiting the LNA has been amplified (e.g., by about 20 dB), the post-LNA buffer must operate in a linear range for a substantially higher power signal, which results in an undesirable increase in power consumption. Since both pre-LNA and post-LNA single-to-differential transformation solutions are unsatisfactory, attempts have been made to integrate the transformation of a single RF signal to a differential signal within the LNA 16.

Therefore there is a need in the art for a circuit and method which provides a single-to-differential signal transformation functionality integrated within a low-noise amplifier or other type circuit arrangements such as buffers, etc.

SUMMARY OF THE INVENTION

According to the present invention, a circuit and method of transforming a single-ended signal to differential signals exhibiting good phase balance independent of signal frequency is disclosed.

According to one aspect of the present invention a circuit is disclosed which receives and single input signal and uses the signal to generate a pair of differential signals. The circuit includes a differential signal phase balance circuit that analyzes the phase of the differential signals and provides compensation based on the phase analysis in order to cause the differential signals to more closely be 180 degrees out of phase with one another independent of signal frequency. The present invention may be employed in various types of single-to-differential circuit applications, for example, buffers and amplifiers.

According to another aspect of the present invention, a single-to-differential LNA is disclosed which exhibits good phase balance independent of signal frequency. According to one exemplary aspect of the present invention, the LNA includes two coupled cascode type LNA amplifiers wherein an AC ground conventionally associated with a bias input is removed and a control node associated with the amplifier consequently is allowed to vary due to parasitic-type coupling effects. The control node voltage variations are a function of the phase balance of the differential signals and cause the timing at which various circuit functions occur to change. Such changes result in the phase of the differential signals to more closely be 180 degrees out of phase with one another, thus providing good phase balance.

According to yet another aspect of the present invention, a method of transforming a single-ended signal into a pair of differential signals exhibiting good phase balance independent of frequency is disclosed. The method includes generating the differential signals using the received single-ended signal and analyzing the phase of the differential signals. A signal compensation is then provided to one or both of the differential signals, wherein the compensation is a function of the degree to which the differential signals are imbalanced. The compensation causes the phase of the differential signals to more closely be 180 degrees out of phase.

According to still another aspect of the present invention, a method of providing good phase balance in a single-to-differential LNA is disclosed. The method includes coupling the differential signals (e.g., capacitive coupling) to a control node of the LNA. The coupling causes the control node voltage to vary based on the phase relationship of the differential signals and the control node voltage variations cause the functionality by which the signals are amplified to be altered and such alterations force the phase of the differential signals to more closely be 180 degrees out of phase with one another.

To the accomplishment of the foregoing and related ends, the invention, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed and the present invention is intended to include all such embodiments and their equivalents. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts.

The present invention is directed to a circuit and method of generating a pair of differential signals which exhibit good phase balance and which the phase balance is independent of the signal frequency. The present invention provides for good differential signal phase balance by providing compensation, which is a function of the differential signal phase relation, and using the compensation to adjust the manner in which the differential signals are provided. As a consequence, the phase of the differential signals is adjusted in such a manner so that the phase relationship is closer to being 180 degrees. According to one particular embodiment, the differential signals are capacitively coupled to a control node of the circuit, the voltage of which is permitted to move about a reference value, thus serving as a virtual ground. The movement of the central node voltage is thus a function of the phase relationship of the differential signals and is used to alter circuit functionality in such a manner that the phase is more balanced.

Figure 1:
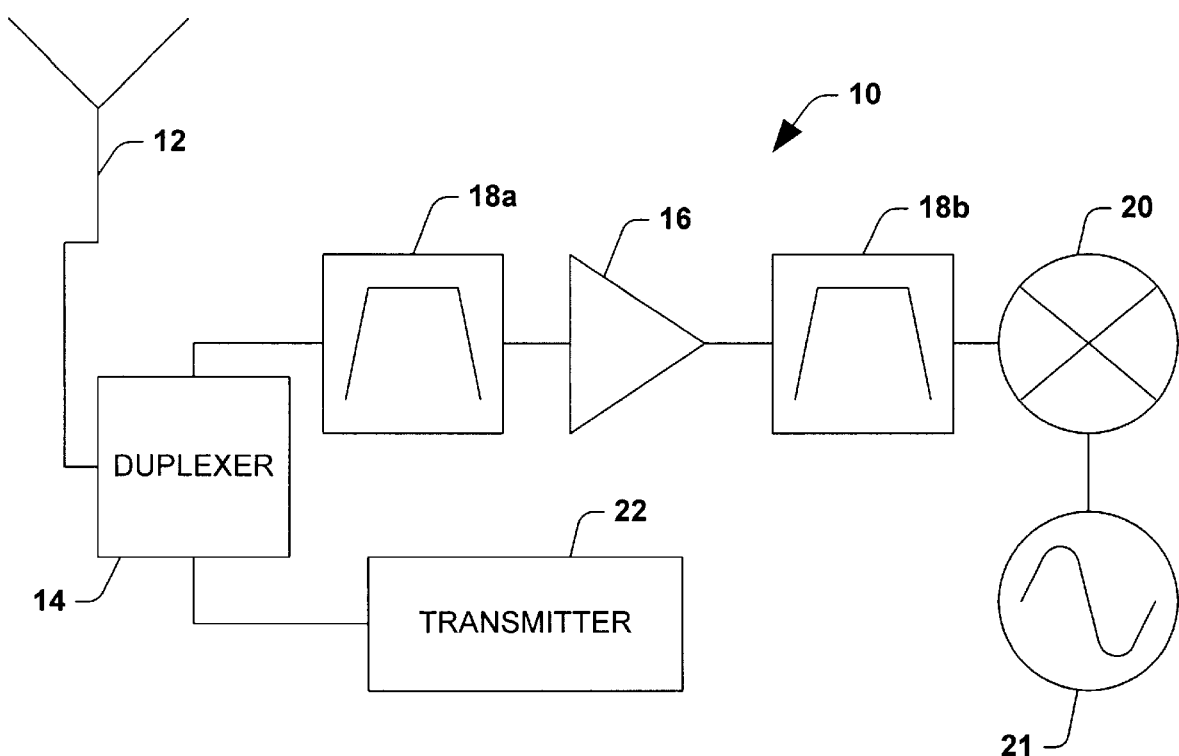
FIG. 1 is a block diagram illustrating a conventional RF front-end receiver which receives a single-ended signal from an antenna and provides a filtered and amplified differential type signal to a mixer therein for translation of the signal to intermediate frequency values.
Figure 2:
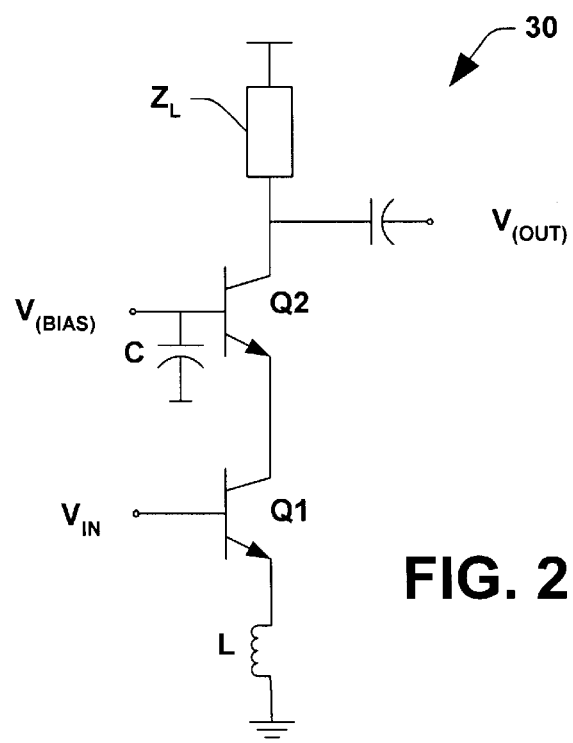
FIG. 2 is a circuit schematic diagram illustrating a cascode-type single-ended signal low-noise amplifier circuit.

In order to appreciate the context in which the present invention operates, a brief discussion of some circuit concepts is provided below. As discussed briefly supra, low noise amplifiers (LNA) are sometimes utilized in front-end type receivers; an exemplary single-ended signal LNA circuit is illustrated in FIG. 2, and designated at reference numeral 30. The LNA 30 includes a pair of cascoded bipolar transistors Q1 and Q2, respectively. The transistor Q1 receives an input voltage signal $V_{IN}$ at its base which reflects the signal received from an antenna or other type source. The emitter of transistor Q1 is coupled to an inductive element L which serves as a degeneration element to linearize the transistor Q1. Transistor Q2 receives a bias voltage $V_{(BIAS)}$ at its base which serves to ensure that transistors Q1 and Q2 are turned on (e.g., about 1.7–2V). A load impedance $Z_L$ is coupled to the collector of transistor Q2, and a large capacitor C is coupled to the base of Q2. The capacitor C provides an AC ground at the Q2 base and serves to keep the base of Q2 from experiencing substantial fluctuations thereat and thereby prevents a coupling of $V_{OUT}$ thereto via the parasitic capacitance associated with Q2. In addition, Q2 and C also boosts the circuit output impedance. In operation, the LNA 30 generates an output voltage $V_{OUT}$ which is an amplified version of the input voltage $V_{IN}$. That is, $V_{OUT}=g_m*Z_{OUT}*V_{IN}$, wherein "$g_m$" is a function of the transconductance of Q1, and $Z_{OUT}$ is the amplifier output impedance.

In some traditional solutions designers use the base idea of the single-ended signal cascode LNA 30 of FIG. 2 to generate a single-to-differential LNA. Recall that differential signals are often desirable in applications where noise is a significant performance issue because the differential signals minimize the coupling of noise with the integrated circuit substrate and also provides for higher device integration. In addition, in front-end receiver applications, it is desirable for the mixer 20, for example, a double balanced Gilbert-type mixer, to utilize differential input signals because the differential signals at the LO port are used to cancel or otherwise reduce noise from the LO block 21 to improve the system NF.

Figure 3:
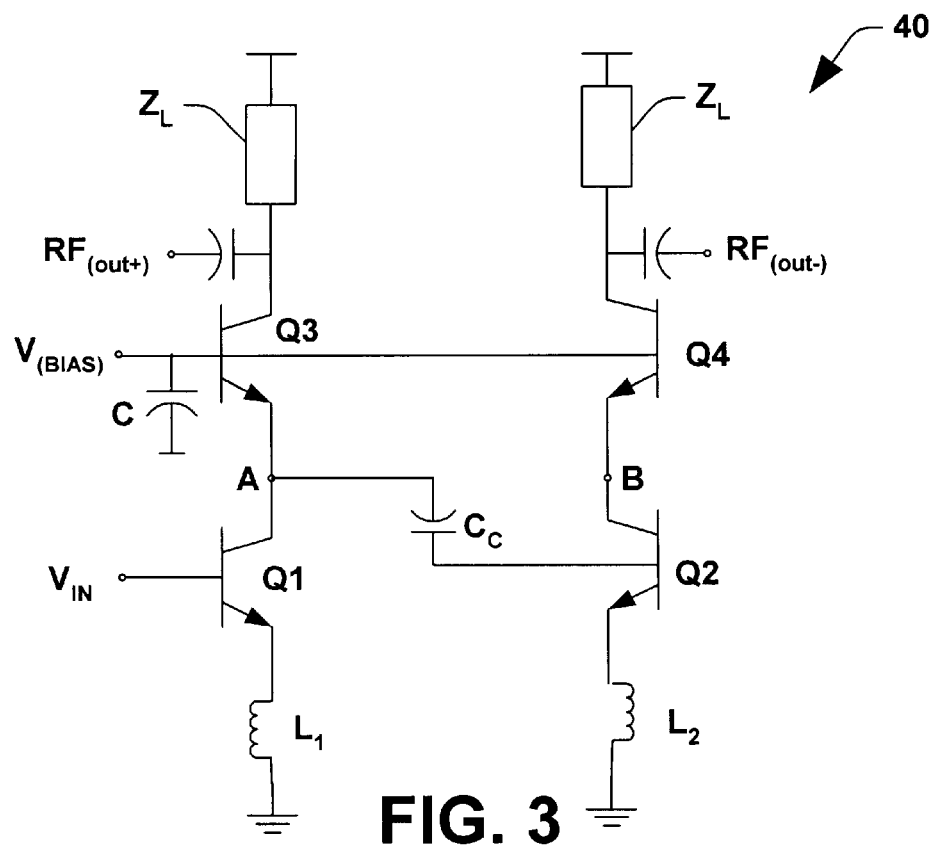
FIG. 3 is a circuit schematic diagram illustrating two cascode-type transistor arrangements coupled together to form a single-to-differential low noise amplifier circuit.

A rudimentary extension of the cascode type LNA for use as a single-to-differential LNA is illustrated in FIG. 3, and designated at reference numeral 40. In operation, an input voltage ($V_{IN}$) at the base of Q1 is converted to a current therein, wherein $I(Q1) \approx g_m V_{IN}$, wherein $g_m$ is the transconductance of Q1. The current I(Q1) is then converted to a voltage V at node A and is approximately 180 degrees (e.g., 180 degrees $\pm \Delta\theta$) out of phase with the input voltage $V_{IN}$ at the base of Q1. The voltage V is coupled to the base of Q2 through a coupling capacitor $C_C$. The transistor Q2 converts the base voltage V to a current in a manner similar to Q1 so that $I(Q2) \approx g_m V$, wherein $g_m$ is the transconductance of Q2. The current I(Q2) is also similarly converted to a voltage at node B and is approximately 180 degrees out of phase with the Q2 base voltage. Therefore the voltages at nodes A and B are approximately 180 degrees out of phase with each other (e.g., 180 degrees $\pm \Delta\theta$) and are utilized to generate amplified differential signals at the LNA differential outputs $RF_{(out+)}$ and $RF_{(out-)}$, respectively (since Q3 and Q4 are biased on via the bias voltage $V_{(BIAS)}$).

At low frequencies the LNA 40 of FIG. 3 works adequately, however, at higher frequencies such as RF frequencies of about 700 MHz or higher, for example, the parasitic capacitances of the various devices (e.g., the base-to-collector capacitances of Q1 and Q2) cause the differential signals to experience varying phase delays such that the signals are not approximately 180 degrees out of phase with each other at nodes A and B. Consequently, the advantages associated with use of the differential signals discussed above will not be properly realized and may cause other undesired performance degradations in subsequent circuits utilizing such differential signals.

It has been discovered by the inventors of the present invention that the AC ground provided by the bias bypass capacitor C which heretofore was considered important to maintain proper operation by decoupling the bias voltage and the LNA differential outputs, is in fact an impediment to achieving a desirable phase balance at high signal frequencies. In accordance with an exemplary aspect of the present invention, therefore, the present invention eliminates the AC ground capacitor C at the bias voltage input and instead allows modest voltage swings thereat. In addition, by employing a blocking resistor at the bias input, a virtual ground is generated between the bias transistors Q3 and Q4 which forces the phases of the differential signals to more closely be 180 degrees out of phase with each other. Therefore the circuit solution of the present invention transforms a single-ended signal into multiple differential signals which exhibit good phase balance at high frequencies. While the present invention is discussed in conjunction with an exemplary LNA circuit, it is to be appreciated that the present invention is equally applicable to any circuit application in which a single-ended signal is transformed into differential signals and any such circuit is contemplated as falling within the scope of the present invention. For example, the present invention may be utilized in buffer circuits or other type circuits, as may be desired.

Figure 4:
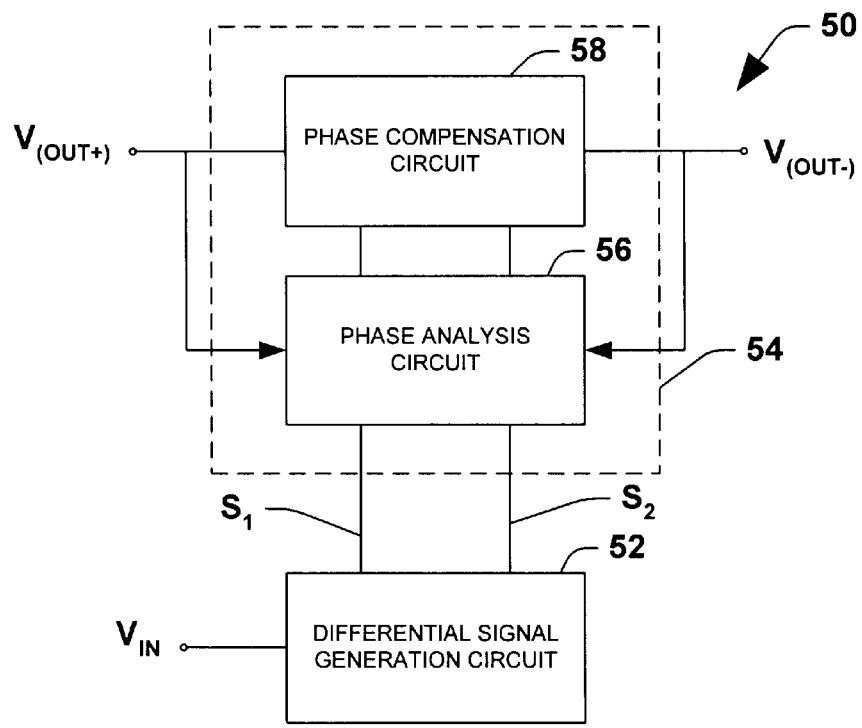
FIG. 4 is a block diagram illustrating a single-to-differential signal transformation circuit employing phase analysis and compensation for improved differential signal phase balance independent of frequency according to the present invention.

A block diagram circuit for transforming a single-ended signal to differential signals according to the present invention is illustrated in FIG. 4, and designated at reference numeral 50. The circuit includes a differential signal generation circuit 52 coupled to a differential signal phase balance circuit 54. The differential signal generation circuit 52 receives a single-ended signal $V_{IN}$ and transforms the single-ended signal into two differential signals $S_1$ and $S_2$ which are generally about 180 degrees out of phase. At low frequencies signals $S_1$ and $S_2$ will be approximately 180 degrees out of phase, however, at RF frequencies parasitic capacitances of circuit elements within the differential signal generation circuit 52 will cause differing phase delays in each of the differential signals such that the phase balance will be poor, that is, $S_1$ and $S_2$ will not be approximately 180 degrees out of phase with one another as desired.

The differential signals $S_1$ and $S_2$ are received by the differential signal phase balance circuit 54 and processed, based on their phase relationship, so that their phase relationship becomes more balanced, that is, approximately 180 degrees out of phase with one another. The phase balancing functionality is achieved by analyzing the phase relationship between signals $S_1$ and $S_2$ via a phase analysis circuit 56 and transmitting such information to a phase compensation circuit 58. The phase compensation circuit 58 provides compensation to either one or both differential signals $S_1$ and $S_2$, for example, delaying a signal, altering a signal, etc., and outputs the compensated signals at outputs $V_{(OUT+)}$ and $V_{(OUT-)}$, respectively. The compensated signal or signals are also preferably fed back to the phase analysis circuit 56 in order to verify that the phase compensation employed in circuit 58 is providing sufficient compensation (e.g., within a predetermined phase balance threshold). If so, no additional adjustments are implemented. Otherwise, using the feedback data, the analysis circuit 56 may provide compensation adjustment data to the compensation circuit 58 for subsequent compensation. Accordingly, the circuit 50 provides a single-to-differential signal transformation having good phase balance independent of signal frequency.

Figure 5:
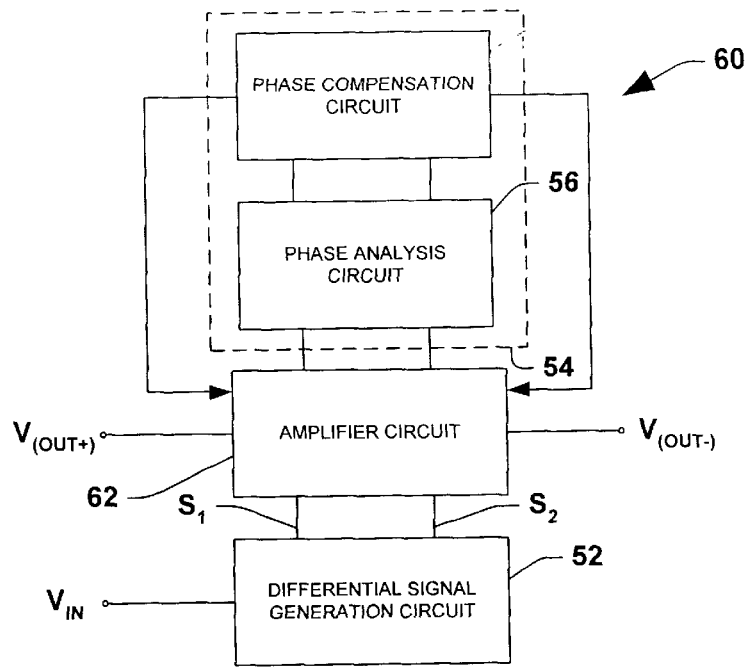
FIG. 5 is a block diagram illustrating a single-to-differential signal transformation and amplifier circuit employing phase analysis and compensation for improved differential signal phase balance independent of frequency according to the present invention.

As discussed supra, the circuit 50 may be employed in a number of diverse circuit applications, for example, a buffer or an amplifier. The utilization of such a circuit within an amplifier such as an LNA is illustrated in FIG. 5, and designated at reference numeral 60. In the circuit 60, the differential signals $S_1$ and $S_2$ are transmitted from the differential signal generation circuit 52 and amplified via an amplifier circuit 62. The amplified differential signals are then fed to the differential signal phase balance circuit 54 as discussed previously. Alternatively, the phase balance functionality may be employed initially followed by differential signal amplification as may be desired.

Figure 6:
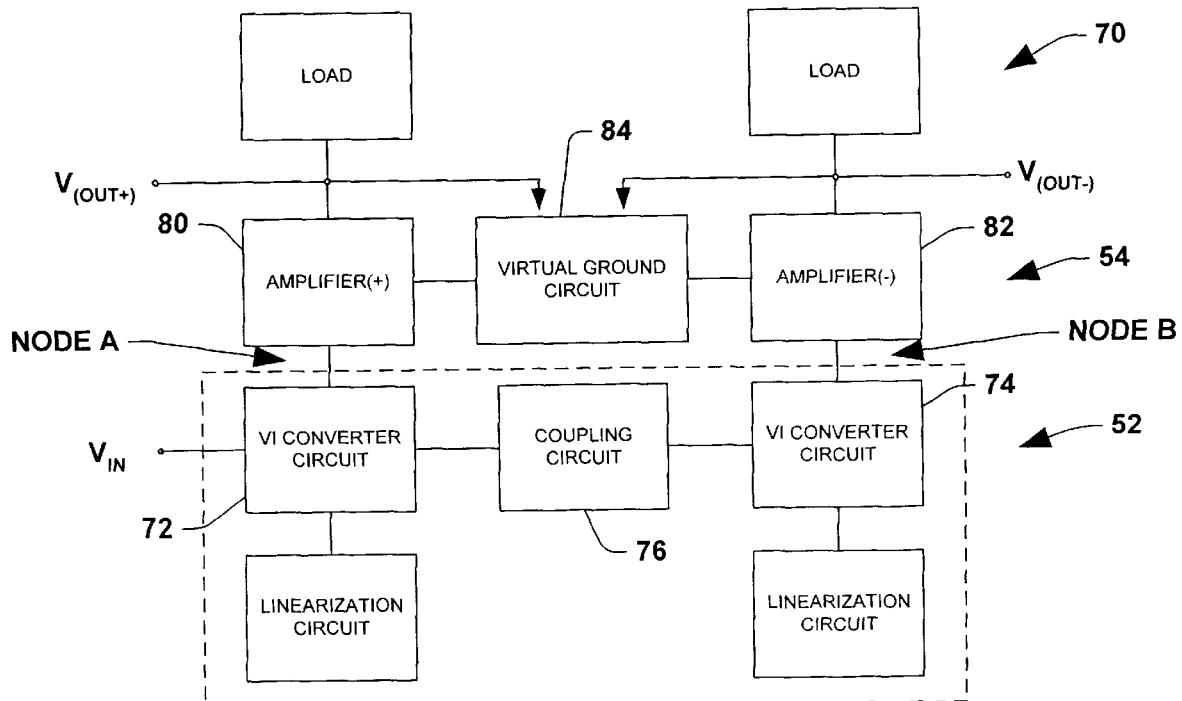
FIG. 6 is a block diagram illustrating an exemplary single-to-differential signal transformation and amplifier circuit of FIG. 5 in greater detail according to the present invention.

An LNA circuit employing the above functionality is illustrated in FIG. 6 in greater detail and is designated by reference numeral 70. The LNA includes the differential signal generation circuit 52, in this exemplary embodiment, as a VI converter circuit 72 which receives an input voltage signal $V_{IN}$, converts the input voltage to a current and then again converts the current back to a voltage appearing at node A, wherein the voltage at node A is about 180 degrees out of phase with $V_{IN}$. The node voltage V(A) is then coupled to another VI converter circuit 74 via a coupling circuit 76. Similarly, the VI converter circuit converts the voltage V(A) to a current and then converts that current to a voltage at node B, wherein V(A) and V(B) are approximately 180 degrees out of phase. Therefore nodes A and B have the differential signals $S_1$ and $S_2$ thereat, respectively.

Still referring to FIG. 6, the differential signals $S_1$ and $S_2$ are transmitted to amplifier circuits 80 and 82, respectively, which are amplified preferably in a traditional manner to generate differential output signals $V_{(out(+))}$ and $V_{(out(-))}$ respectively. The circuit outputs are then fed back to a virtual ground circuit 84 which provides compensation to the amplifiers 80 and 82 such that the phase of the signals become more balanced during amplification.

Figure 7:
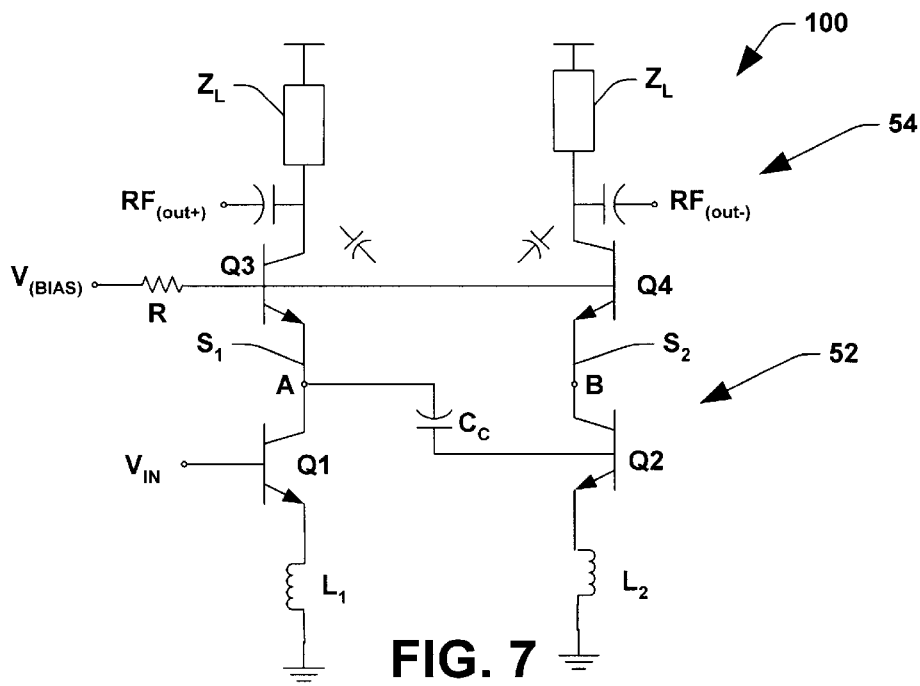
FIG. 7 is a detailed schematic circuit diagram illustrating a single-to-differential LNA exhibiting good differential signal phase balance independent of frequency according to the present invention.

A detailed schematic diagram of a single-to-differential LNA according to an exemplary aspect of the present invention is illustrated in FIG. 7, and designated by reference numeral 100. The differential signal generation circuit 52 receives an input signal $V_{IN}$, for example, an RF input signal from an antenna to the base of bipolar transistor Q1 and the voltage is converted to a current I(Q1) The transistor Q1 then converts the current I(Q1) into a voltage at node A, wherein $V(A) \approx V_{IN}$ and is approximately 180 degrees out of phase therewith. The node voltage V(A) is then coupled through a coupling capacitor $C_C$ to transistor Q2 which converts the voltage V(A) to a current $I(Q2) \approx gmV(A)$. The voltage is then converted to a current and back to a voltage at node B, wherein V(B) is about 180 degrees out of phase with the base voltage V(A); therefore V(A) and V(B) are the differential signals $S_1$ and $S_2$ which are approximately 180 degrees out of phase with one another (e.g., 180 degrees $\pm\Delta\theta$).

At low frequencies the phase balance may be sufficient, however, at RF frequencies various phase delays due to, for example, the coupling capacitor $C_C$ and the parasitic capacitances of Q1 and Q2, the phase balance of $S_1$ and $S_2$ may be poor. The phase balance circuit portion 54 provides compensation to improve the phase balance in the following exemplary manner. The bias input terminal $V_{(BIAS)}$ is coupled to transistors Q3 and Q4 through a blocking resistor R (e.g., about 10 k$\Omega$). Noticeably absent is an AC ground such as a capacitor on the $V_{(BIAS)}$ terminal. Consequently, instead of holding the base voltage of Q3 and Q4 constant as was the conventional orthodoxy, the base of Q3 and Q4 is permitted to move with respect to any AC coupling. Such coupling may occur in a capacitive manner via the parasitic capacitances of Q3 and Q4. Therefore the $RF_{(OUT+)}$ and $RF_{(OUT-)}$ output signals will couple to the base of Q3 and Q4 via the $C_{CB}$ of Q3 and Q4, and $S_1$ and $S_2$ will couple similarly via the $C_{BE}$ of Q3 and Q4, respectively. Since $RF_{(OUT+)}$ and $RF_{(OUT-)}$ are amplified by the circuit in a traditional fashion (e.g., by about 20 dB), the capacitive coupling from the amplifier outputs typically will be substantially more significant then the contributions of $S_1$ and $S_2$.

The AC base coupling of transistors Q3 and Q4 is utilized to provide phase compensation in the following manner, and will be discussed in conjunction with FIGS. 7 and 8. When the differential output signals are not 180 degrees out of phase (see, e.g., region 120 of FIG. 8), the AC coupling from the outputs to the base of Q3 and Q4 will have an accumulative impact (e.g., the AC coupling of the differential signals will not cancel each other out), thus causing the base voltage of Q3 and Q4 to increase above $V_{(BIAS)}$ as illustrated in region 122 of FIG. 8. Because the base voltage of Q3 is now higher than normal, as $S_1$ increases, Q3 will turn off later than it would have otherwise; similarly with Q4, as $S_2$ decreases, Q4 will turn off sooner, thus causing the phases at the outputs $RF_{(OUT+)}$ and $RF_{(OUT-)}$ to more closely approximate a 180 degree phase difference, as illustrated in FIG. 8.

Figure 8:
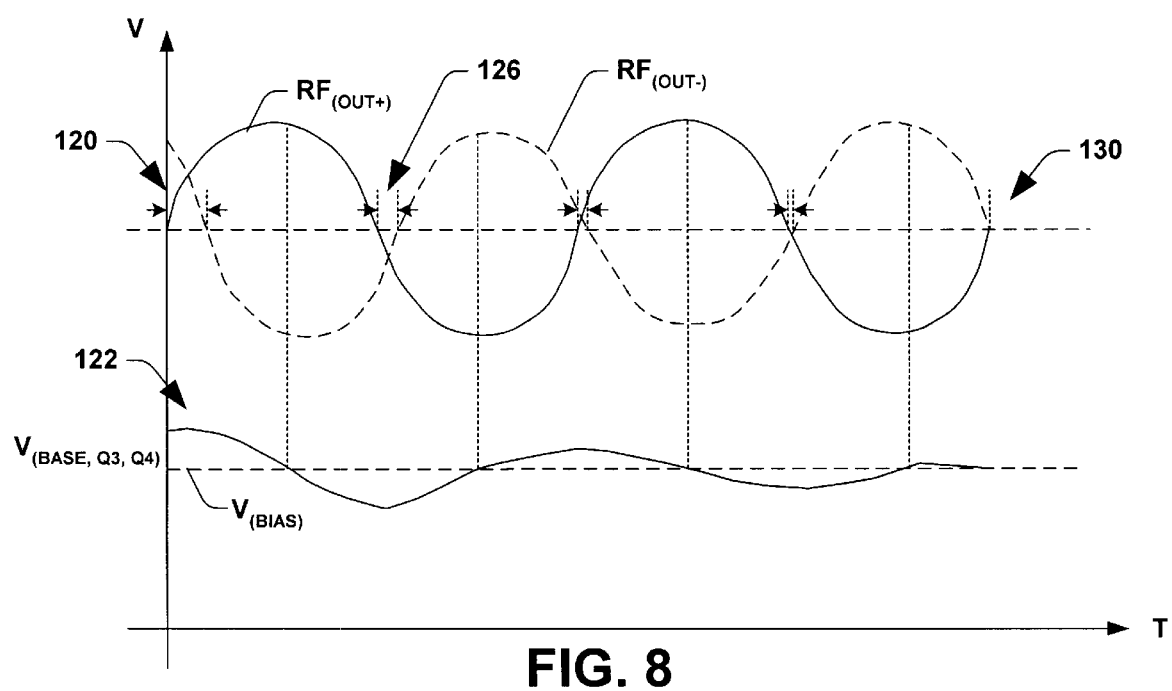
FIG. 8 is a graph illustrating a plurality of circuit nodes in the circuit of FIG. 7, wherein lack of phase balance results in a dynamic node voltage offset which impacts the timing at which various components within the circuit become activated and inactivated, respectively.

The AC coupling discussed above creates a dynamic "moving voltage" at the base of Q3 and Q4 about $V_{(BIAS)}$, as illustrated in FIG. 8 thus making the base, as a control node, a virtual ground. In region 126, the accumulated AC coupling is negative and the base voltage of Q3 and Q4 (the virtual ground) falls below $V_{(BIAS)}$. Consequently, as $S_1$ decreases, Q3 will turn on later and as $S_2$ increases, Q4 will turn off sooner, thus further causing the phases of $RF_{(OUT+)}$ and $RF_{(OUT-)}$ to more closely approximate a 180 degree phase difference. Ultimately, for example, at region 130 of FIG. 8, the output differential signals will approach being 180 degrees out of phase with each other and the AC coupling from the outputs will cancel each other out, causing the base of Q3 and Q4 to stay approximately at $V_{(BIAS)}$. In the above manner, the base of Q3 and Q4 are used as a virtual ground and permitted to float to provide phase compensation, thereby resulting in improved phase balance between the differential outputs $RF_{(OUT+)}$ and $RF_{(OUT-)}$.

Although the present invention has been disclosed above in conjunction with a bipolar type circuit implementation, the present invention also extends to MOS, BiCMOS and other circuit topologies and methodologies, as may be desired. Furthermore, the present invention may be implemented as a discrete circuit or as an integrated circuit solution. Any manner of implementing the inventive concepts of the present invention may be employed and are contemplated as falling within the scope of the present invention.

Figure 9:
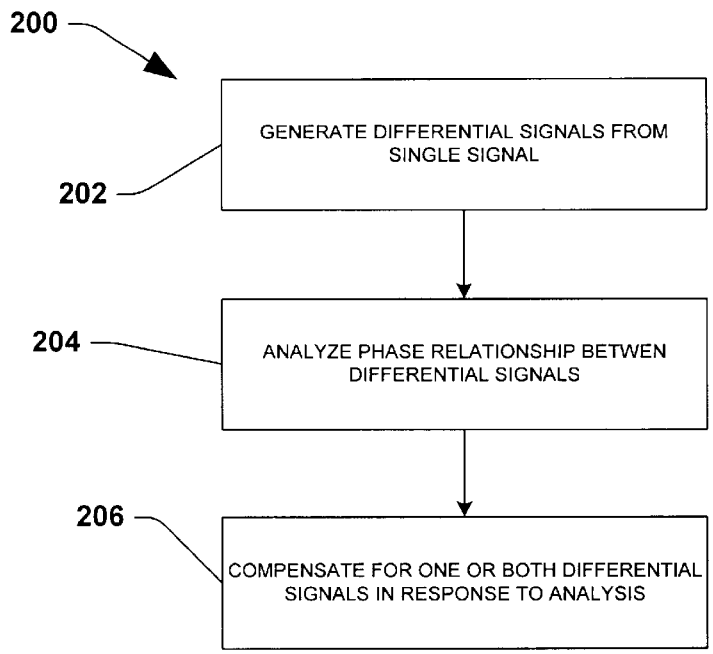
FIG. 9 is a flow chart diagram illustrating a method of providing phase balance in a single-to-differential signal transformation circuit according to the present invention.

According to another aspect of the present invention, a method of providing accurate phase balance in circuits generating high frequency differential signals is disclosed in FIG. 9, and designated at reference numeral 200. The method 200 is initiated by taking a single input signal, such as a high frequency signal in a front-end RF receiver, and generating differential signals therefrom at step 202. Any circuit or manner of generating the differential signals may be utilized and is contemplated as falling within the scope of the present invention. The method 200 continues at step 204, wherein the phase relationship of the generated differential signals are analyzed. Subsequently, compensation is provided at step 206 to either one or both of the differential signals based on the phase analysis of step 204 in order to make the phase relationship therebetween to more closely approximate a 180 degree out of phase relationship. In the above manner, good phase balance is achieved independent of the frequency of the signal transformation.

Figure 10:
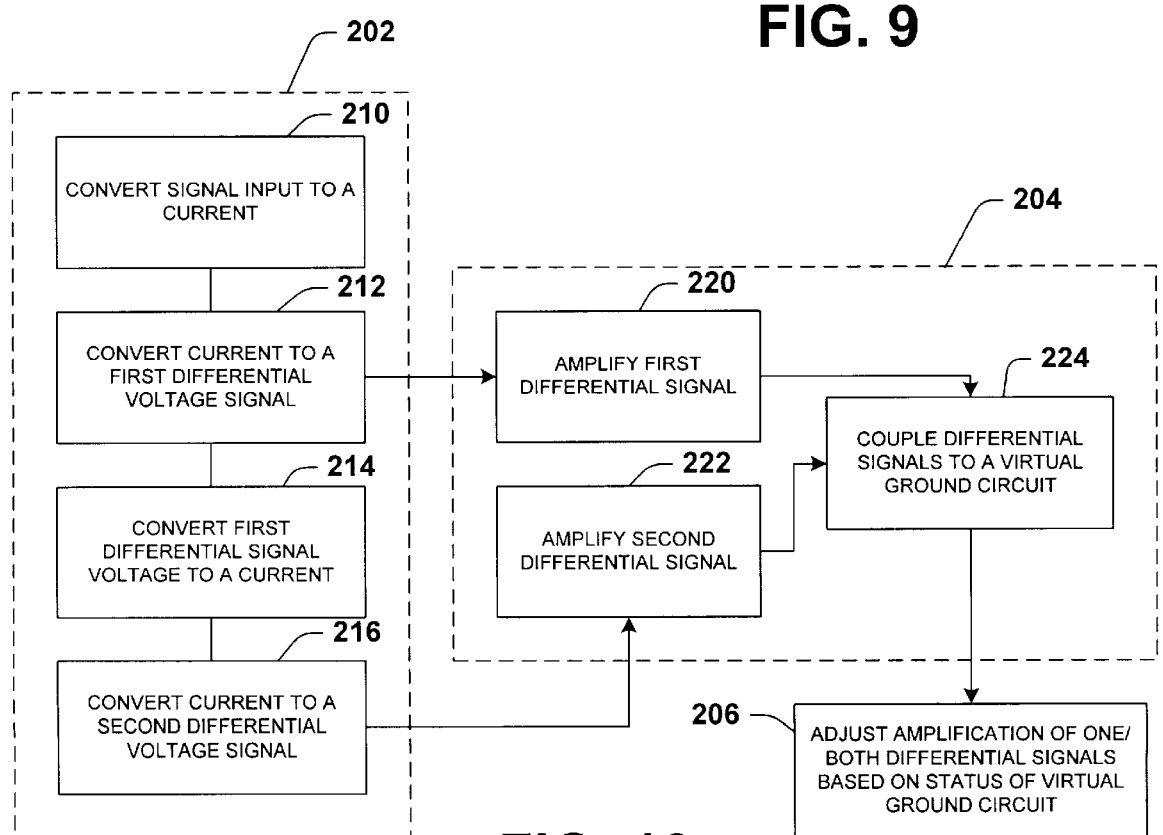
FIG. 10 is a flow chart diagram illustrating a method of providing phase balance in a single-to-differential signal transformation and amplification circuit according to the present invention.

One exemplary manner of implementing the method 200 of FIG. 9 is illustrated in FIG. 10. For example, the step of generating the differential signals (step 202) may be implemented by converting the single-ended signal input into a current at step 210 and then converting the current back to a voltage representing the first differential signal at step 212. The second differential signal is similarly generated by converting the first differential signal into a current at step 214 and then converting the current to a second differential voltage signal, wherein the differential signals are approximately 180 degrees out of phase.

The phase relationship analysis (step 204 of FIG. 9) may then be conducted by amplifying the differential signals at steps 220 and 222 and coupling the amplified differential signals to a virtual ground circuit at step 224. The virtual ground circuit provides for a signal to vary (or a status signal to be generated) based on the differential signal phase relationship. The signal variation (or status) is then used to adjust a manner in which the differential signal(s) are amplified at step 206. For example, the varying signal or status may be utilized to alter a rate or timing at which one or more of the differential signals are amplified, however, other modifications may also be made to effectuate phase balancing and such modifications are contemplated as falling within the scope of the present invention. In the above manner, good phase balance may be established between the differentials signals which is independent of the frequency of the single-to-differential signal transformation.

Figure 11:
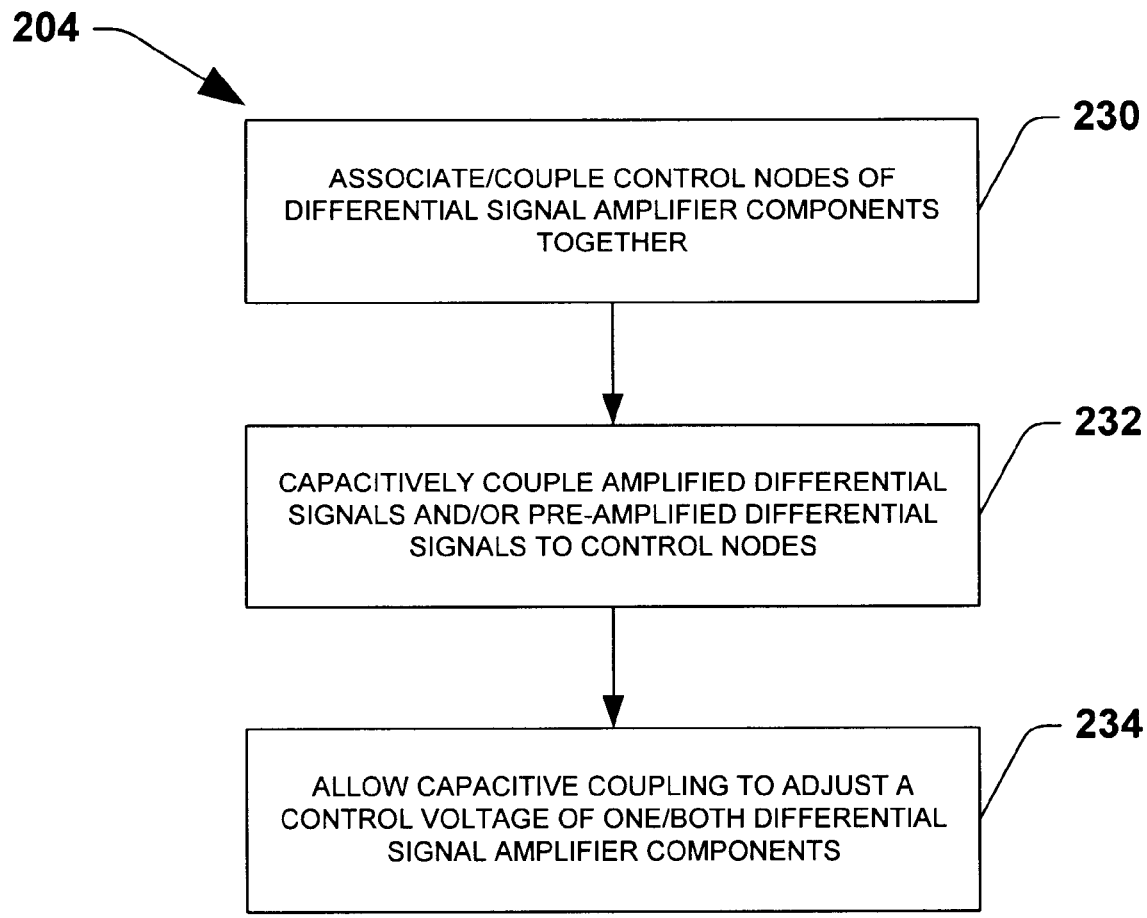
FIG. 11 is a flowchart diagram illustrating an exemplary method of analyzing the phase relationship between differential signals according to the present invention.

One exemplary manner of analyzing the phase relationship between the differential signals (step 204) is illustrated in FIG. 11. The phase analysis couples or otherwise associates the control nodes of one or more various components utilized in amplifying the differential signals at step 230. The post-amplification or pre-amplification differential signals (or both) are then capacitively coupled to the control node or nodes at step 232 and the capacitively coupling of the differential signals (whether or not exactly 180 degrees out of phase) to form a control node voltage adjustment at the control nodes of one or both of the amplifier components at step 234. The control node voltage adjustment then impacts a manner in which the differential signals are amplified such that the differential signals more closely reach a 180 degree out of phase relationship.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A single-to-differential signal transformation circuit, comprising:
    a differential signal generation circuit operable to receive a single-ended signal and generate a pair of differential signals having a phase relationship associated therewith;
    a phase analysis circuit operably coupled to the differential signal generation circuit, wherein the phase analysis circuit is operable to ascertain the phase relationship between the differential signals and generate a status indication associated therewith; and
    a compensation circuit operably coupled to the phase analysis circuit, wherein the compensation circuit is operable to alter a function of the transformation circuit based on the status indication from the phase analysis circuit, and wherein the altered function causes the phase relationship of the differential signals which form a circuit output to be closer to 180 degrees than an initial phase relationship generated by the differential signal generation circuit.

2. The single-to-differential transformation circuit of claim 1, wherein the compensation circuit is further operable to control a timing operation of a component within the transformation circuit based on the status indication, and wherein the component timing operation impacts one or both of the differential signals which form the circuit output, thereby impacting their phase relationship.

3. The single-to-differential transformation circuit of claim 1, wherein the status indication of the phase analysis circuit comprises a voltage which has a magnitude which varies as a function of the phase relationship of the differential signals.

4. The single-to-differential transformation circuit of claim 3, wherein the compensation circuit comprises a pair of transistors each having a control node, and wherein the variable voltage from the phase analysis circuit is operably coupled to the control nodes, and wherein the voltage magnitude impacts a timing in which the transistors turn on or turn off, respectively.

5. The single-to-differential transformation circuit of claim 4, wherein the control nodes of the transistor pair are coupled together to form a single control node, and wherein each transistor provides an output for one of the pair of differential signals, respectively, and wherein the voltage magnitude on the single control node causes one of the transistors to turn on or off sooner than would otherwise while the voltage magnitude causes the other transistor to turn on or off later than would otherwise, thereby causing the phase relationship of the differential signal pair to more closely be 180 degrees out of phase than the initial phase relationship.

6. The single-to-differential transformation circuit of claim 4, wherein the transistors comprise bipolar transistors and the control node comprises a base terminal of the bipolar transistors.

7. The single-to-differential transformation circuit of claim 1, wherein the phase analysis circuit comprises a virtual ground circuit which is coupled to the differential signals, and wherein the status indication comprises a voltage value which reflects the phase relationship of the differential signals.

8. The single-to-differential transformation circuit of claim 7, wherein the virtual ground circuit is capacitively coupled to the differential signals.

9. The single-to-differential transformation circuit of claim 7, wherein the voltage value comprises a summation of signals associated with the differential signals, and wherein a magnitude of the voltage value reflects an amount of phase imbalance associated with the differential signals.

10. A single-to-differential LNA, comprising:
    differential signal generation circuit operable to receive a single-ended signal and generate a pair of differential signals having a phase relationship associated therewith;
    an amplifier circuit operable to amplify the differential signals; and
    a phase balancing circuit operable to balance the phase of the differential signals based on the phase relationship of the differential signals prior to amplification, after amplification, or both, wherein the phase balancing circuit further comprises a virtual ground circuit, wherein the virtual ground circuit has a node voltage associated therewith having a magnitude that varies as a function of the phase relationship of the differential signals, and wherein the node voltage is used to alter an operation of the transformation circuit such that the phase relationship becomes more balanced than the initial phase relationship.

11. A single-to-differential LNA, comprising:

a differential signal generation circuit operable to receive a single-ended signal and generate a pair of differential signals having a phase relationship associated therewith;

an amplifier circuit operable to amplify the differential signals; and a phase balancing circuit operable to balance the phase of the differential signals based on the phase relationship of the differential signals prior to amplification, after amplification, or both, wherein the phase balancing circuit comprises a coupling circuit, and wherein one or more signals associated with the differential signals either before amplification, after amplification, or both, are reflected at a control node of the coupling circuit to form a voltage magnitude which reflects the phase relationship of the differential signals.

12. The single-to-differential LNA of claim 11, wherein the voltage magnitude of the coupling circuit is utilized to control a timing in which one or more components in the amplifier circuit operate, and wherein the timing control results in a phase relationship which is more balanced than the initial phase relationship.

13. A single-to-differential LNA, comprising:

a differential signal generation circuit operable to receive a single-ended signal and generate a pair of differential signals having a phase relationship associated therewith;

amplifier circuit operable to amplify the differential signals; and a phase balancing circuit operable to balance the phase of the differential signals based on the phase relationship of the differential signals prior to amplification, after amplification, or both, wherein the phase balancing circuit further comprises:

a phase analysis circuit operably coupled to the differential signal generation circuit, wherein the phase analysis circuit is operable to ascertain the phase relationship between the differential signals and generate a status indication associated therewith; and a compensation circuit operably coupled to the phase analysis circuit, wherein the compensation circuit is operable to alter a function of the transformation circuit based on the status indication from the phase analysis circuit, and wherein the altered function causes the phase relationship of the differential signals which form a circuit output to be closer to 180 degrees than an initial phase relationship generated by the differential signal generation circuit.

14. The single-to-differential transformation circuit of claim 13, wherein the compensation circuit is further operable to control a timing operation of a component within the transformation circuit based on the status indication, and wherein the component timing operation impacts one or both of the differential signals which form the circuit output, thereby impacting their phase relationship.

15. The single-to-differential transformation circuit of claim 13, wherein the status indication of the phase analysis circuit comprises a voltage which has a magnitude which varies as a function of the phase relationship of the differential signals.

16. The single-to-differential transformation circuit of claim 15, wherein the compensation circuit comprises a pair of transistors each having a control node, and wherein the variable voltage from the phase analysis circuit is operably coupled to the control nodes, and wherein the voltage magnitude impacts a timing in which the transistors turn on or turn off, respectively.

17. The single-to-differential transformation circuit of claim 16, wherein the control nodes of the transistor pair are coupled together to form a single control node, and wherein each transistor provides an output for one of the pair of differential signals, respectively, and wherein the voltage magnitude on the single control node causes one of the transistors to turn on or off sooner than would otherwise while the voltage magnitude causes the other transistor to turn on or off later than would otherwise, thereby causing the phase relationship of the differential signal pair to more closely be 180 degrees out of phase than the initial phase relationship.

18. The single-to-differential transformation circuit of claim 16, wherein the transistors comprise bipolar transistors and the control node comprises a base terminal of the bipolar transistors.

19. The single-to-differential transformation circuit of claim 13, wherein the phase analysis circuit comprises a virtual ground circuit which is coupled to the differential signals, and wherein the status indication comprises a voltage value which reflects the phase relationship of the differential signals.

20. The single-to-differential transformation circuit of claim 19, wherein the virtual ground circuit is capacitively coupled to the differential signals.

21. The single-to-differential transformation circuit of claim 19, wherein the voltage value comprises a summation of signals associated with the differential signals, and wherein a magnitude of the voltage value reflects an amount of phase imbalance associated with the differential signals.

* * * * *